United States Patent
Baek et al.

(10) Patent No.: US 7,800,138 B2
(45) Date of Patent: Sep. 21, 2010

(54) SEMICONDUCTOR DEVICE INCLUDING THERMALLY DISSIPATING DUMMY PADS

(75) Inventors: Joong-Hyun Baek, Gyeonggi-do (KR); Sung-Jun Im, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/136,608

(22) Filed: Jun. 10, 2008

(65) Prior Publication Data

US 2009/0057880 A1  Mar. 5, 2009

(30) Foreign Application Priority Data

Sep. 3, 2007  (KR)  ...... 10-2007-0089083

(51) Int. Cl.
| | |
|---|---|
| H01L 27/10 | (2006.01) |
| H01L 29/74 | (2006.01) |
| H01L 23/02 | (2006.01) |
| H01L 23/053 | (2006.01) |
| H01L 23/12 | (2006.01) |
| H01L 23/48 | (2006.01) |
| H01L 23/52 | (2006.01) |
| H01L 29/40 | (2006.01) |
| H01L 23/58 | (2006.01) |
| H01L 21/338 | (2006.01) |

(52) U.S. Cl. .............. 257/211; 257/686; 257/700; 257/734; 257/758; 257/777; 257/798; 257/E21.453; 438/183; 438/926

(58) Field of Classification Search ........... 257/686, 257/734, 758, 798, E21.453; 438/183, 926
See application file for complete search history.

(56) References Cited

U.S. PATENT DOCUMENTS 6,028,367 A * 2/2000 Yu ..................... 257/780
6,219,243 B1 * 4/2001 Ma et al. .............. 361/704

(Continued)

FOREIGN PATENT DOCUMENTS

JP  06-210892  8/1994

(Continued)

OTHER PUBLICATIONS

English language abstract of Japanese Publication No. 06-210892.

(Continued)

*Primary Examiner*—Ida M Soward
(74) *Attorney, Agent, or Firm*—Volentine & Whitt, PLLC

(57) ABSTRACT

A semiconductor device capable of improving the efficiency of dispersing heat via a dummy pad. The semiconductor device may be included in a semiconductor package, stack module, card, or system. Also disclosed is a method of manufacturing the semiconductor device. In the semiconductor device, a semiconductor substrate has a first surface and a second surface opposite to the first surface, and at least one conductive pad is arranged on a predetermined region of the first surface. At least one dummy pad is arranged on the first or second surface, and is not electrically coupled to the at least one conductive pad. The dummy pad or pads may be used to disperse heat. Accordingly, it is possible to increase the efficiency of dispersing heat of a semiconductor device, thereby improving the yield of semiconductor devices.

3 Claims, 9 Drawing Sheets

U.S. PATENT DOCUMENTS

| | | | |
|---|---|---|---|
| 6,353,189 B1 * | 3/2002 | Shimada et al. | 174/255 |
| 6,483,176 B2 * | 11/2002 | Noguchi et al. | 257/666 |
| 6,621,117 B2 * | 9/2003 | Araki et al. | 257/314 |
| 6,650,015 B2 * | 11/2003 | Chen et al. | 257/738 |
| 6,710,443 B1 * | 3/2004 | Rost et al. | 257/712 |
| 6,717,209 B1 * | 4/2004 | Kim et al. | 257/328 |
| 6,861,715 B2 * | 3/2005 | Zhang | 257/390 |
| 7,274,074 B2 * | 9/2007 | Koubuchi et al. | 257/374 |
| 7,425,498 B2 * | 9/2008 | Shimizu | 438/595 |
| 7,619,305 B2 * | 11/2009 | Fan et al. | 257/686 |
| 7,622,684 B2 * | 11/2009 | Takano et al. | 174/527 |
| 7,629,689 B2 * | 12/2009 | Maeda | 257/758 |
| 2004/0031004 A1 * | 2/2004 | Yoshioka | 716/7 |
| 2006/0022195 A1 * | 2/2006 | Wang | 257/48 |
| 2006/0145347 A1 * | 7/2006 | Aida | 257/758 |
| 2007/0001100 A1 * | 1/2007 | Hsu et al. | 250/214.1 |
| 2007/0029673 A1 * | 2/2007 | Yamaguchi | 257/737 |
| 2007/0090469 A1 * | 4/2007 | Kurita | 257/407 |
| 2007/0273012 A1 * | 11/2007 | Ikuta | 257/675 |
| 2007/0278560 A1 * | 12/2007 | Watanabe | 257/315 |
| 2008/0067690 A1 * | 3/2008 | Kumagai | 257/774 |

FOREIGN PATENT DOCUMENTS

| | | | |
|---|---|---|---|
| JP | 06-229163 | | 8/1994 |
| JP | 2003008186 A | * | 1/2003 |
| KR | 2003-0067501 | | 8/2003 |

OTHER PUBLICATIONS

English language abstract of Japanese Publication No. 06-229163.
English language abstract of Korean Publication No. 2003-0067501.

* cited by examiner

SEMICONDUCTOR DEVICE INCLUDING THERMALLY DISSIPATING DUMMY PADS

CROSS-REFERENCE TO RELATED PATENT APPLICATIONS

This application claims the benefit of Korean Patent Application No. 10-2007-0089083, filed on Sep. 3, 2007, in the Korean Intellectual Property Office, the disclosure of which is incorporated herein in its entirety by reference.

BACKGROUND OF THE INVENTION

1. Field of the Invention

The present invention relates to a semiconductor product, and more particularly, to a semiconductor device, a method of manufacturing the same, and a semiconductor package, stacked module, card, and system that have such a semiconductor device.

2. Description of the Related Art

In general, as the integration densities of semiconductor products increase, semiconductor devices are stacked in units of chips or packages. In such a stacked structure, the same type or different types of chips can be deposited within one package in the vertical direction, using a penetrating electrode technique. Such a semiconductor package having a stacked structure has been applied to high-integration and high-performance systems.

For example, Japanese Patent Laid-Open Publication No. 2006-210892 discloses a semiconductor device with a stacked structure of large scale integrated circuit chips (LSI chips). In the semiconductor device, a thermally conductive underfill resin is formed between LSI chips adjacent to each other in the vertical direction and between the bottom of a lowermost LSI chip and a substrate. A heat dissipating sheet contacts and covers a surface side of an uppermost LSI chip from among the LSI chips, a side surface of each of the LSI chips, and a side surface of the thermally conductive underfill resin. A heat sink is located to cover the whole laminated structure.

However, the above semiconductor device needs the heat dissipating sheet and the heat sink in order to discharge heat, and thus the integration density of a semiconductor package may be lowered. Further, after completing a stacked structure of the semiconductor device, the heat dissipating sheet and the heat sink are sequentially adhered to the resultant structure, thereby complicating the manufacturing process.

SUMMARY OF THE INVENTION

The present invention provides a semiconductor device in which internally generated heat can be effectively dispersed, and a method of manufacturing the same.

The present invention also provides a semiconductor package, a stack module, a card and a system that use such a semiconductor device.

According to an aspect of the present invention, there is provided a semiconductor device, in which a semiconductor substrate has a first surface and a second surface opposite to the first surface. At least one conductive pad may be arranged on a predetermined region of the first surface, and at least one dummy pad may be arranged on the first or second surface. The at least one dummy pad is not electrically coupled to the at least one conductive pad and may be used to disperse heat.

The at least one dummy pad may include a plurality of dummy pads, and the semiconductor device may further include connecting lines that connect the dummy pads to one another.

The semiconductor device may further include at least one redistribution pad being electrically coupled to the at least one conductive pad.

The semiconductor device may further include at least one penetrating electrode being electrically coupled to the at least one conductive pad or the at least one redistribution pad while passing through the semiconductor substrate.

According to another aspect of the present invention, there is provided a semiconductor device, in which a semiconductor substrate has a first surface and a second surface opposite to the first surface. At least one conductive pad may be arranged on a predetermined region of the first surface. At least one redistribution pad may be electrically coupled to the at least one conductive pad. A plurality of dummy pads may be arranged on the first surface or the second surface. The dummy pads are not electrically coupled to the at least one conductive pad and the at least one redistribution pad and are used in order to disperse heat. Connecting lines may connect the dummy pads to one another. At least one penetrating electrode may be electrically coupled to the at least one conductive pad or the at least one redistribution pad while passing through the semiconductor substrate. Also, a base substrate may be arranged below the semiconductor substrate and coupled to the semiconductor substrates.

According to another aspect of the present invention, there is provided a method of manufacturing a semiconductor device. In the method, a semiconductor substrate having a first surface and a second surface opposite to the first surface is prepared. Next, at least one conductive pad may be formed on the first surface. Then, at least one dummy pad may be formed on the first surface or the second surface. The dummy pad is not electrically coupled to the at least one conductive pad and is used in order to disperse heat.

According to another aspect of the present invention, there is provided a semiconductor package, in which a plurality of semiconductor substrates each having a first surface and a second surface opposite to the second surface are stacked. At least one conductive pad may be arranged on a predetermined region of the first surface of each of the semiconductor substrates. At least one dummy pad may be arranged on the first or second surface of each of the semiconductor substrates. The dummy pad is not electrically coupled to the at least one conductive pad and is used in order to disperse heat.

According to another aspect of the present invention, there is provided a stack module, in which a plurality of semiconductor substrates each having a first surface and a second surface opposite to the first surface are stacked. At least one conductive pad may be arranged on a predetermined region of the first surface of each of the semiconductor substrates. At least one redistribution pad may be electrically coupled to the at least one conductive pad. A plurality of dummy pads may be arranged on the first surface or the second surface, and are not electrically coupled to the at least one conductive pad and the at least one redistribution pad, and are used in order to disperse heat. Connecting lines may connect the dummy pads to one another. At least one penetrating electrode may be electrically coupled to the at least one conductive pad or the at least one redistribution pad. A base substrate may be arranged below the semiconductor substrates so that it can be electrically coupled to the at least one penetrating electrode. An external terminal may be attached to the base substrate.

According to an aspect of the present invention, there is provided a card, in which a memory may be one of the semiconductor device, the semiconductor package, or the stack module, and a controller may control the memory and exchange data with the memory.

According to an aspect of the present invention, there is provided a system, in which a memory may be one of the semiconductor device, the semiconductor package, or the stack module. A processor may control communication via the memory, a bus, and an input/output device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
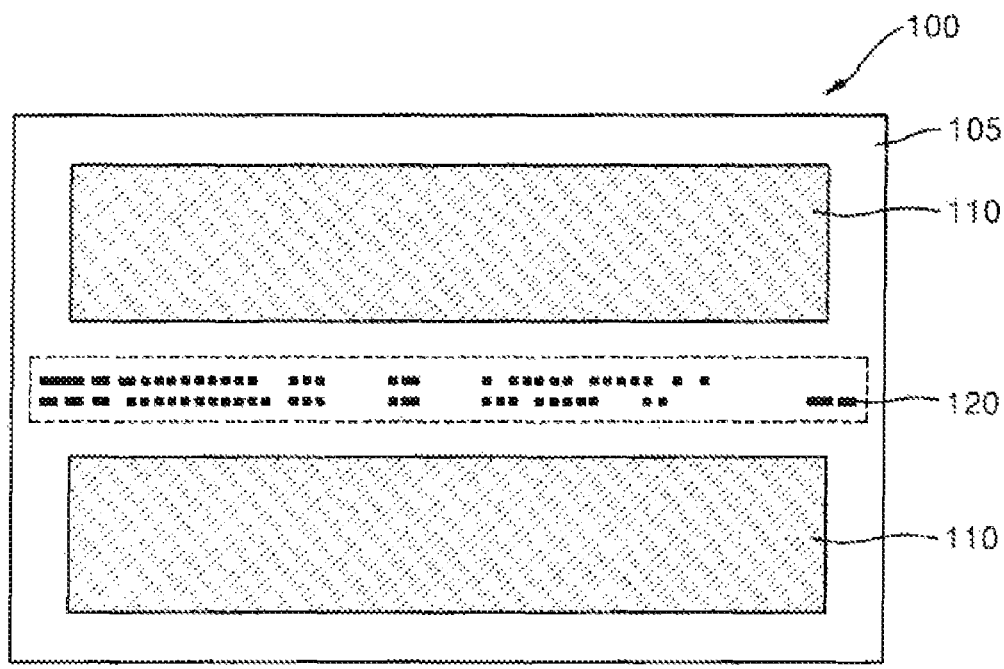
FIG. 1 is a plan view of a semiconductor device according to an embodiment of the present invention.

Exemplary embodiments of the present invention will now be described more fully with reference to the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art.

In the drawings, the thickness of layers and regions may be exaggerated for clarity. It will also be understood that when a layer is referred to as being "on" another layer or substrate, it can be directly on the other layer or substrate, or intervening layers may also be present. The same reference numerals represent the same elements throughout the drawings. It will be understood by those skilled in the art that various changes in form and details may be made therein without departing from the spirit and scope of the invention as defined by the appended claims.

Semiconductor Device

Figure 2:
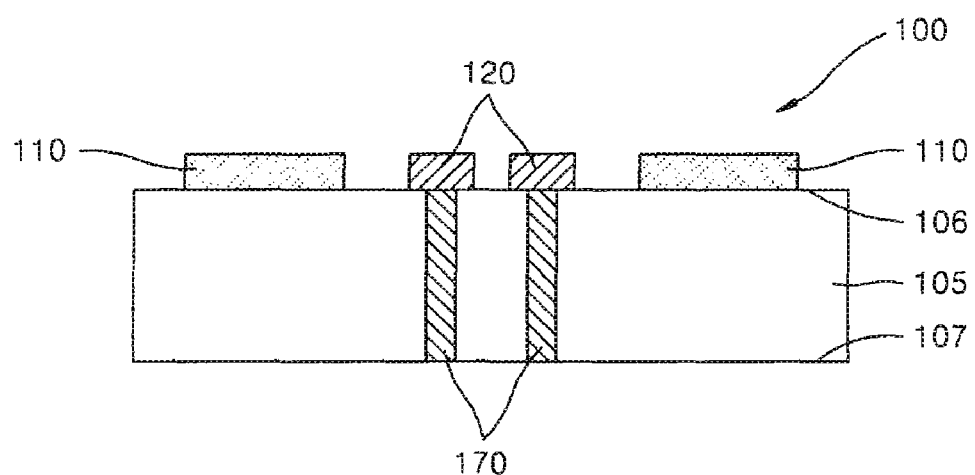
FIG. 2 is a cross-sectional view of the semiconductor device illustrated in FIG. 1.

FIG. 1 is a plan view of a semiconductor device 100 according to an embodiment of the present invention. FIG. 2 is a cross-sectional view of the semiconductor device 100 illustrated in FIG. 1.

Referring to FIGS. 1 and 2, a semiconductor substrate 105 may include a semiconductor wafer or a semiconductor chip. Thus, the semiconductor substrate 105 can include a circuit structure (not shown) on a semiconductor material. For example, the semiconductor material may include silicon, germanium and/or silicon germanium. The semiconductor substrate 105 may have a first surface 106 and a second surface 107 opposite to the first surface 106.

The circuit structure may vary according to the type of the semiconductor device 100. For example, the semiconductor device 100 may include a memory circuit or a logic circuit. Thus, the circuit structure may include an array of active devices, e.g., an array of transistors, capacitors and/or resistors, on the semiconductor substrate 105, but the present invention is not limited thereto.

The circuit structure on the semiconductor substrate 105 can be protected from an external environment via an insulating material, such as a passivation layer (not shown). The passivation layer may be formed on the first surface 106 of the semiconductor substrate 105 and be adequately patterned to expose an output unit of the circuit structure.

For example, one or more conductive pads 120 may be provided as output units of the circuit structure. The conductive pads 120 may be arranged on a predetermined region of the first surface 106 of the semiconductor substrate 105, and be exposed from the passivation layer. In this example embodiment, the conductive pads 120 may have a center pad structure. For example, the conductive pads 120 may be arranged near the center of the semiconductor substrate 105.

The conductive pads 120 may be formed in one or more lines near the center of the semiconductor substrate 105. However, the total number and arrangement of the conductive pads 120 may be appropriately determined according to the circuit structure, and the present invention is not limited thereto.

One or more penetrating electrodes 170 may be respectively coupled to the conductive pads 120 from the semiconductor substrate 105. For example, the penetrating electrodes 170 may extend to the second surface 170 of the semiconductor substrate 105 while passing through the conductive pad 120. Thus, the penetrating electrodes 170 can rearrange the conductive pads 120 from the first surface 106 of the semiconductor substrate 105 to the second surface 107 thereof.

One or more dummy pads 110 may be provided on the first surface 106 or the second surface 107 of the semiconductor substrate 105. The dummy pads 110 can be provided to discharge heat from the semiconductor device 100, and thus are not electrically coupled to the circuit structure on the semiconductor substrate 105 and the conductive pads 120.

The dummy pads 110 may be formed of the same conductive material as the penetrating electrode 170, but the present invention is not limited thereto. Also, the dummy pads 110 may be arranged along both sides of the center pad structure of the conductive pads 120.

In the semiconductor device 100, heat generated by the circuit structure or the conductive pads 120 may be evenly discharged in the direction of sides of the semiconductor substrate 105 via the dummy pads 110. Thus, it is possible to prevent the heat from being concentrated near the center of the semiconductor substrate 105 having the conductive pads 120. If the dummy pads 110 are not present, the heat may be locally concentrated near the center of the semiconductor substrate 105. Such locally concentrated heat may significantly lower the operating reliability of the circuit structure.

Figure 3:
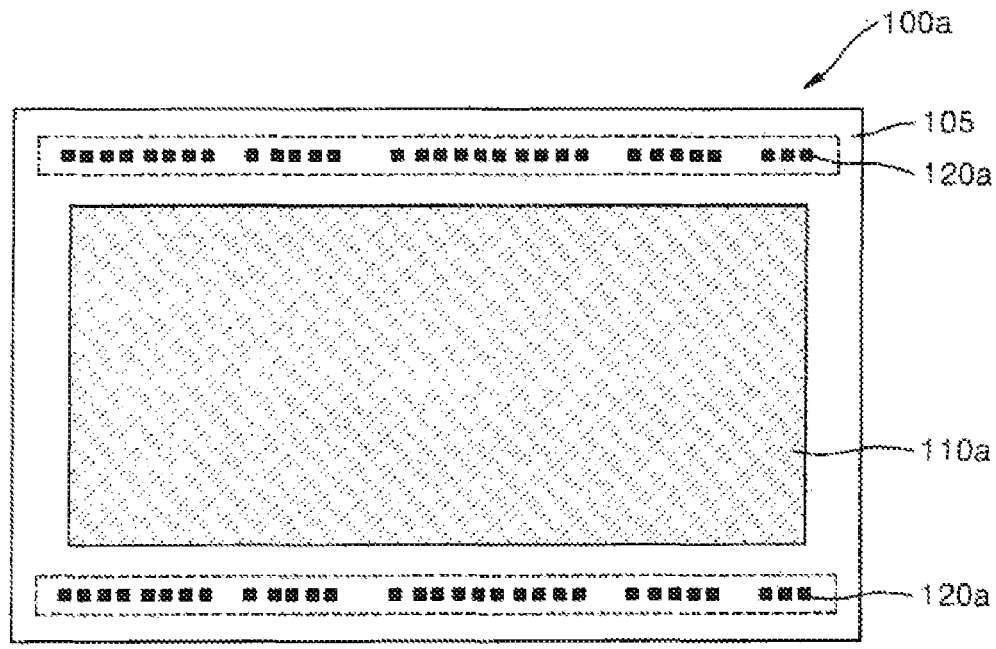
FIG. 3 is a plan view of a semiconductor device according to another embodiment of the present invention.

FIG. 3 is a plan view of a semiconductor device 100*a* according to another embodiment of the present invention. The semiconductor device 100*a* is similar to the semiconductor device 100 illustrated in FIGS. 1 and 2, and thus, a detailed description of constitutional elements of the semiconductor device 100*a* that are the same as those of the semiconductor device 100 will be omitted here.

Referring to FIG. 3, conductive pads 120*a* may have an edge pad structure. For example, the conductive pads 120*a* may be arranged along both sides of a semiconductor substrate 105. Dummy pads 110*a* may be arranged between the edge pad structures of the conductive pads 120*a*. Thus, heat generated by the circuit structure or the conductive pads 120*a* may be evenly dispersed over the semiconductor substrate 105 via the dummy pads 110*a*.

Accordingly, in the semiconductor device 100*a*, the heat concentrated along the edges of the semiconductor substrate 105 can be dispersed over the whole surface of the semiconductor substrate 105. Thus, it is possible to prevent the heat from being locally concentrated on the semiconductor device 100*a*.

Figure 4:
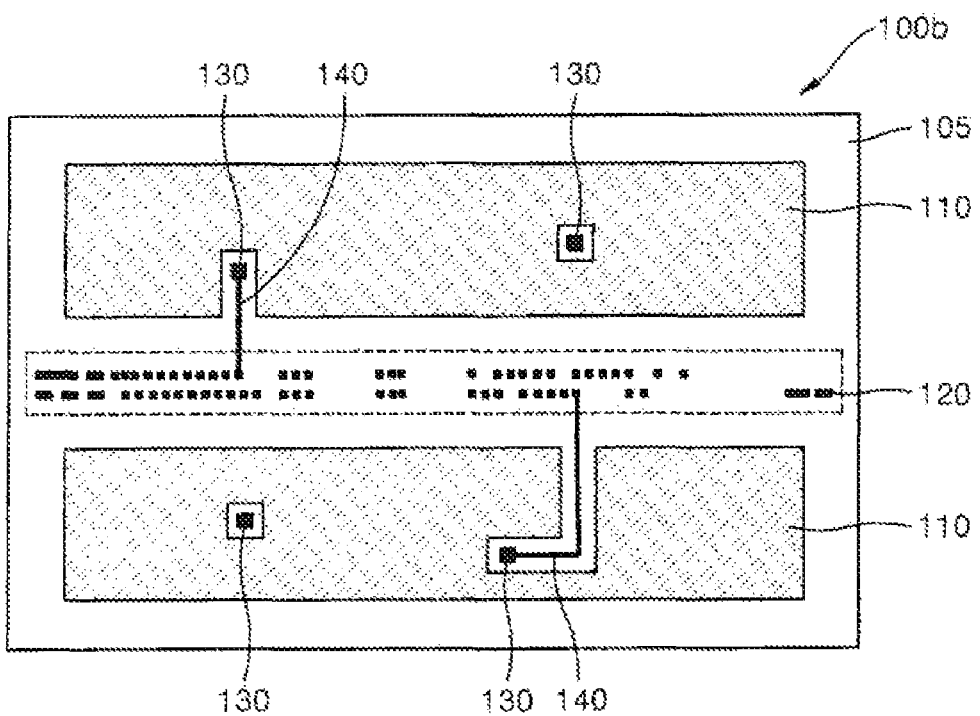
FIG. 4 is a plan view of a semiconductor device according to another embodiment of the present invention.

FIG. 4 is a plan view of a semiconductor device 100*b* according to another embodiment of the present invention. The semiconductor device 100*b* is similar to the semiconductor device 100 illustrated in FIGS. 1 and 2, and thus, a detailed description of constitutional elements of the semiconductor device 100*b* that are the same as those of the semiconductor device 100 will be omitted here.

Referring to FIG. 4, one or more redistribution pads 130 may be provided on a first surface 106 of a semiconductor substrate 105 so that they can be electrically coupled to conductive pads 120. For example, the redistribution pads 130 may be electrically coupled to the conductive pads 120 via redistribution lines 140. The arrangement of the redistribution pads 130 and the redistribution lines 140 are illustrative, and the present invention is not limited thereto.

The redistribution pads 130 and the redistribution lines 140 are not electrically and physically coupled to dummy pads 110. For example, the dummy pad 110 may be formed in regions excluding the redistribution pads 130 and the redistribution lines 140. For another example, the dummy pads 110 may be arranged at layers where the redistribution lines 140 are not present so that they are not coupled to the redistribution lines 140.

The dummy pads 110 may be arranged along both sides of a center pad structure of the conductive pads 120. In this case, the dummy pads 110 arranged along both sides of the center pad structure may have the same shape or a different shape from one another.

Figure 5:
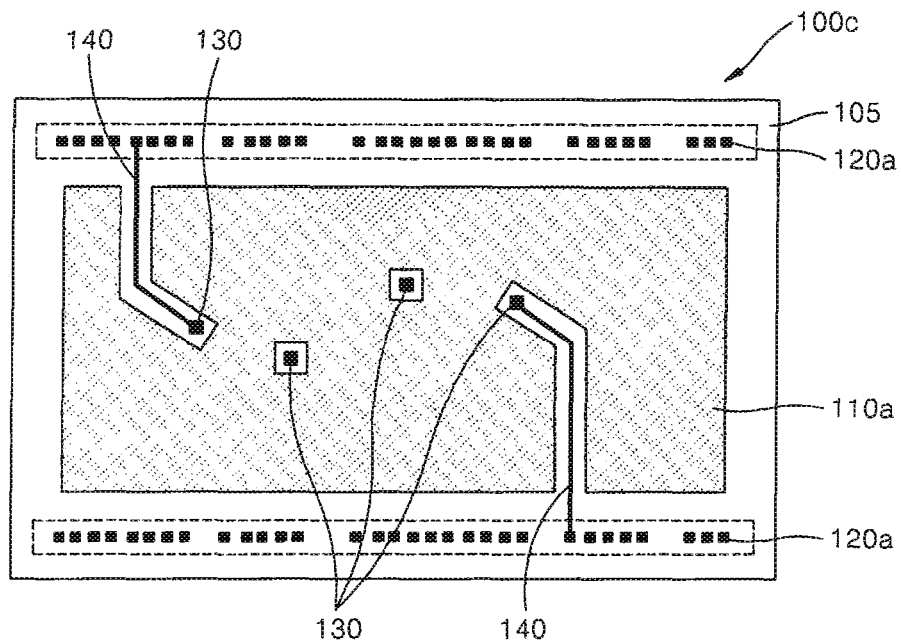
FIG. 5 is a plan view of a semiconductor device according to another embodiment of the present invention.

FIG. 5 is a plan view of a semiconductor device 100*c* according to another embodiment of the present invention. Referring to FIG. 5, redistribution pads 130 may be electrically coupled to edge pad structures of conductive pads 120*a* via redistribution lines 140. The redistribution pads 130 and the redistribution lines 140 may extend from the conductive pads 120*a* toward a dummy pad 110*a*.

The dummy pad 110*a* may be limited to a region excluding the redistribution pads 130. Further, the dummy pad 110*a* may be limited to a region excluding the redistribution lines 140 or be formed at a layer where the redistribution lines 140 are not present.

Figure 6:
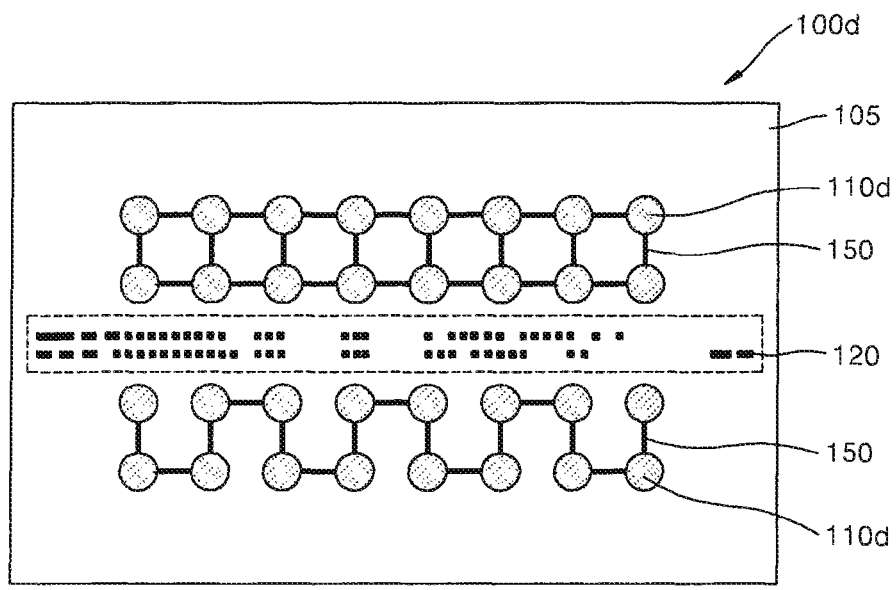
FIG. 6 is a plan view of a semiconductor device according to another embodiment of the present invention.

FIG. 6 is a plan view of a semiconductor device 100*d* according to another embodiment of the present invention. The semiconductor device 100*d* is similar to the semiconductor device 100 illustrated in FIGS. 1 and 2, and thus, a detailed description of constitutional elements of the semiconductor device 100*d* that are the same as those of the semiconductor device 100 will be omitted here.

Referring to FIG. 6, a plurality of dummy pads 110*d* may be arranged along both sides of a center pad structure of conductive pads 120. The dummy pads 110*d* may be coupled to one another via connecting lines 150 on a semiconductor substrate 105. For example, the connecting lines 150 may be a metal pattern.

Further, the dummy pads 110*d* may be arranged to be symmetric or asymmetric with respect to the conductive pads 120. A group of dummy pads 110*d* may be coupled to one another in the form of a lattice, and the other group of the dummy pads 110*d* may be coupled to one another in a string. Alternatively, substantially all dummy pads 110*d* may have either the lattice form or the string form.

Accordingly, heat generated by the conductive pads 120 or a circuit structure coupled thereto can be delivered to the dummy pads 110*d* near the conductive pads 120, and then be rapidly dispersed between the dummy pads 110*d* via the connecting lines 150. The sizes of the dummy pads 110*d* and the widths and total number of the connecting lines 150 on the semiconductor substrate 105 may be variously determined.

Figure 7:
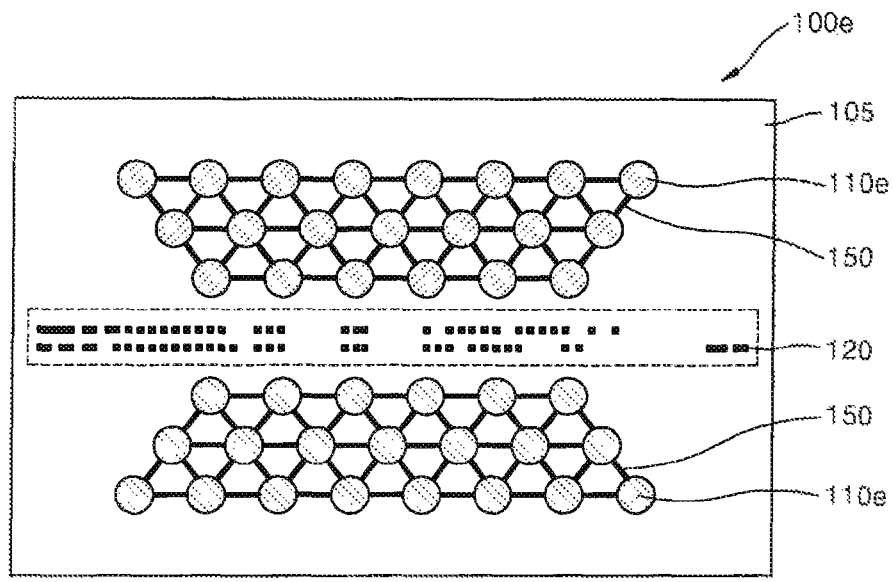
FIG. 7 is a plan view of a semiconductor device according to another embodiment of the present invention.

FIG. 7 is a plan view of a semiconductor device 100*e* according to another embodiment of the present invention. The semiconductor device 100*e* is similar to the semiconductor device 100*d* illustrated in FIG. 6, and thus, a detailed description of constitutional elements of the semiconductor device 100*e* that are the same as those of the semiconductor device 100*d* will be omitted here.

Referring to FIG. 7, dummy pads 110*e* may be arranged along both sides of a center pad structure of conductive pad 120, and be coupled to one another in the form of a lattice via connecting lines 150. The dummy pads 110*e* may be arranged to be symmetric or asymmetric with respect to the conductive pads 120.

Figure 8:
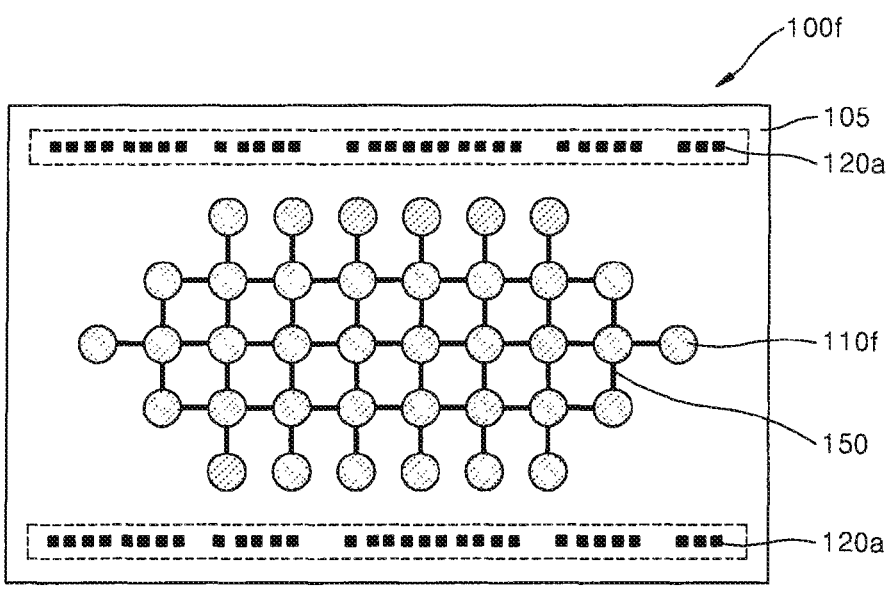
FIG. 8 is a plan view of a semiconductor device according to another embodiment of the present invention.

FIG. 8 is a plan view of a semiconductor device 100*f* according to an embodiment of the present invention. The semiconductor device 100*f* is similar to the semiconductor device 100*a* or 100*d* illustrated in FIG. 3 or 6, and thus, a detailed description of constitutional elements of the semiconductor device 100*f* that are the same as those of the semiconductor device 100*a* or 100*d* will be omitted here.

Referring to FIG. 8, dummy pads 110*f* may be arranged between edge pad structures of conductive pads 120*a*. The dummy pads 110*f* may be coupled to one another via connecting lines 150. For example, some of the dummy pads 100*f* may be coupled to one another in the form of a lattice.

Thus, the dummy pads 110*f* and the connecting lines 150 can disperse heat generated along the edge of a semiconductor substrate 105 over the center of the semiconductor substrate 105, thereby facilitating delivery of the heat.

Figure 9:
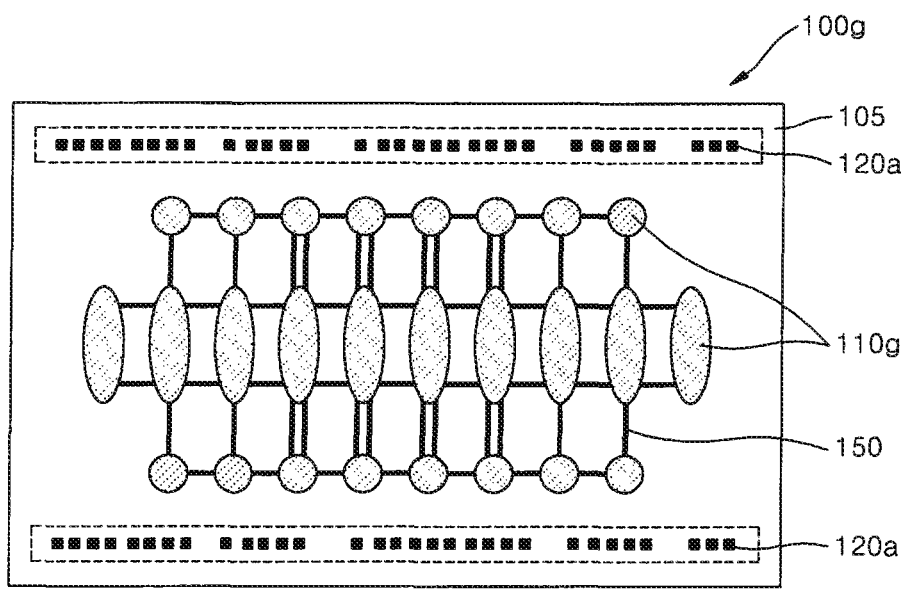
FIG. 9 is a plan view of a semiconductor device according to another embodiment of the present invention.

FIG. 9 is a plan view of a semiconductor device 100*g* according to an embodiment of the present invention. The semiconductor device 100*g* is similar to the semiconductor device 100*f* illustrated in FIG. 8, and thus, a detailed description of constitutional elements of the semiconductor device 100*g* that are the same as those of the semiconductor device 100*f* will be omitted here.

Referring to FIG. 9, dummy pads 110*g* may be manufactured to have different sizes. For example, it is possible to arrange long dummy pads 110*g* near the center of a semiconductor substrate 105 having elongated shapes, such as an oval shape, in the direction of the width of the semiconductor substrate 105, and smaller dummy pads 110g near the edges of the semiconductor substrate 105. The dummy pads 110g may have other shapes, such as a spherical or polygonal shape, facilitating the dispersal of heat. Thus, it is possible to rapidly disperse heat generated at the edge of the semiconductor substrate 105 toward the center thereof in the direction of the width of the semiconductor substrate 105.

FIGS. 1 through 9 illustrate the exemplary arrangements of the conductive pads 120 or 120a, and thus, are not limited to the disclosed exemplary arrangements. Further, the arrangements and shapes of the dummy pads 110, 110a, 110d, 110e, 110f, and 110g are illustrative, and thus can be variously changed so as to effectively disperse heat generated by the semiconductor substrate 105.

Figure 10:
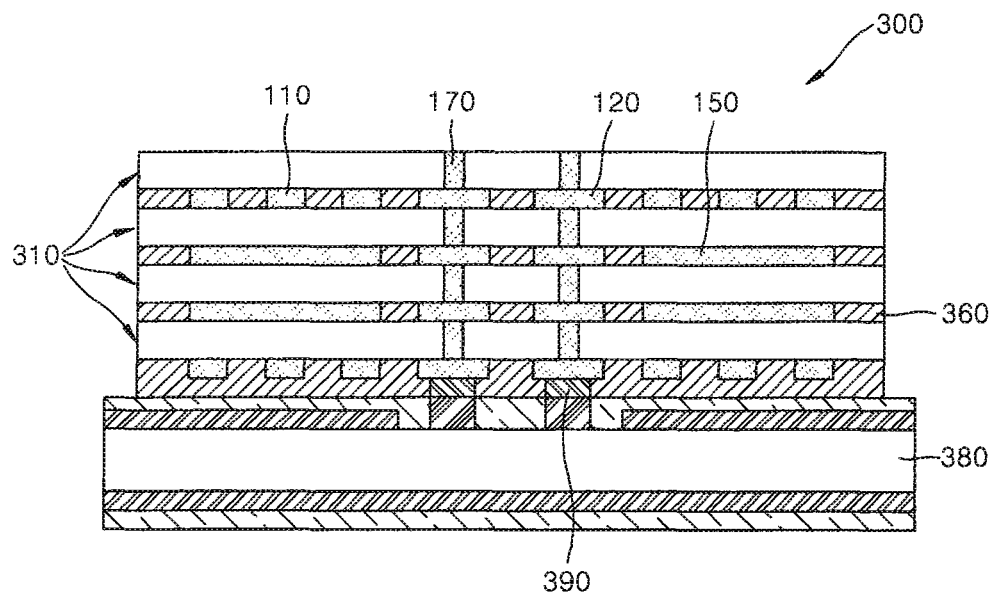
FIG. 10 is a cross-sectional view of a semiconductor package according to an embodiment of the present invention.

FIG. 10 is a cross sectional view of a semiconductor package 300 according to an embodiment of the present invention. Referring to FIG. 10, a plurality of semiconductor devices 310 may be stacked on a base substrate 380. The semiconductor devices 310 may have a center pad structure of conductive pads 120. For example, the semiconductor devices 310 may have the same construction as one of the semiconductor devices 100, 100b, 100d, or 100e illustrated in FIGS. 1, 4, 6 and 7.

The arrangements of dummy pads 110 and connecting lines 150 of each of semiconductor devices 310 may be the same as or different from those of dummy pads 110 and connecting lines 150 of the other semiconductor devices 310. The conductive pads 120 of the semiconductor devices 310 may be coupled to one another via penetrating electrodes 170 in the vertical direction. The semiconductor devices 310 may be adhered to one another via an adhesive 360. In this case, the adhesive 360 may include carbon nano tube particles in order to improve the performance of heat transfer. The semiconductor devices 310 can be electrically coupled to a base substrate 380 via solders 390. The base substrate 380 may have a printed circuit board (PCB).

Figure 11:
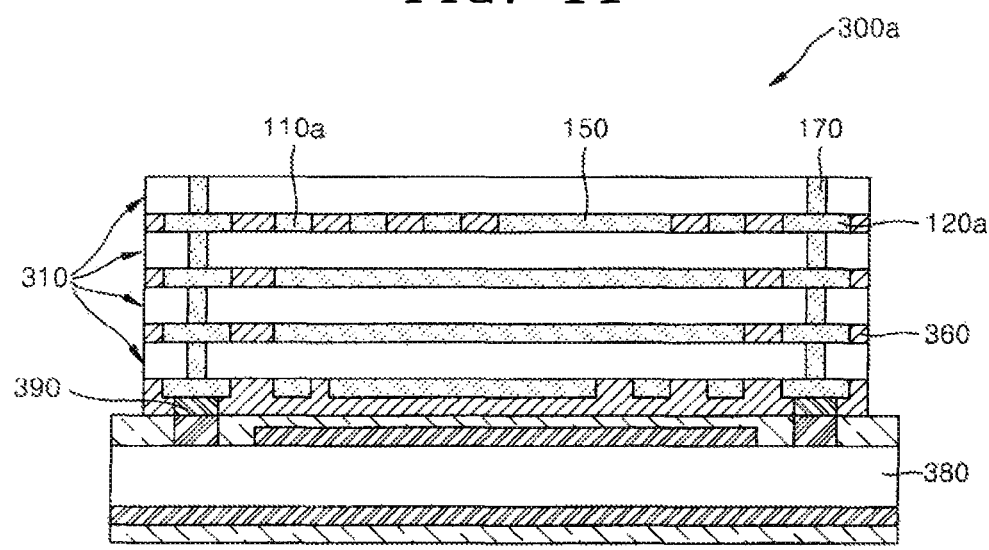
FIG. 11 is a cross-sectional view of a semiconductor package according to another embodiment of the present invention.

FIG. 11 is a cross sectional view of a semiconductor package 300a according to another embodiment of the present invention. The semiconductor package 300a is similar to the semiconductor package 300 illustrated in FIG. 10 and thus, a detailed description of constitutional elements of the semiconductor package 300a that are the same as those of the semiconductor package 300 will be omitted here.

Referring to FIG. 11, a plurality of semiconductor devices 310 may be stacked on a base substrate 380. The semiconductor devices 310 may have edge pad structures of conductive pads 120a. For example, the semiconductor devices 310 may have the same structure as one of the semiconductor devices 100a, 100c, 100f, or 100g illustrated in FIGS. 3, 5, 8 and 9.

The above semiconductor packages 300 and 300a may be formed at a wafer-level, and can be referred to as a wafer-level stack package.

Figure 12:
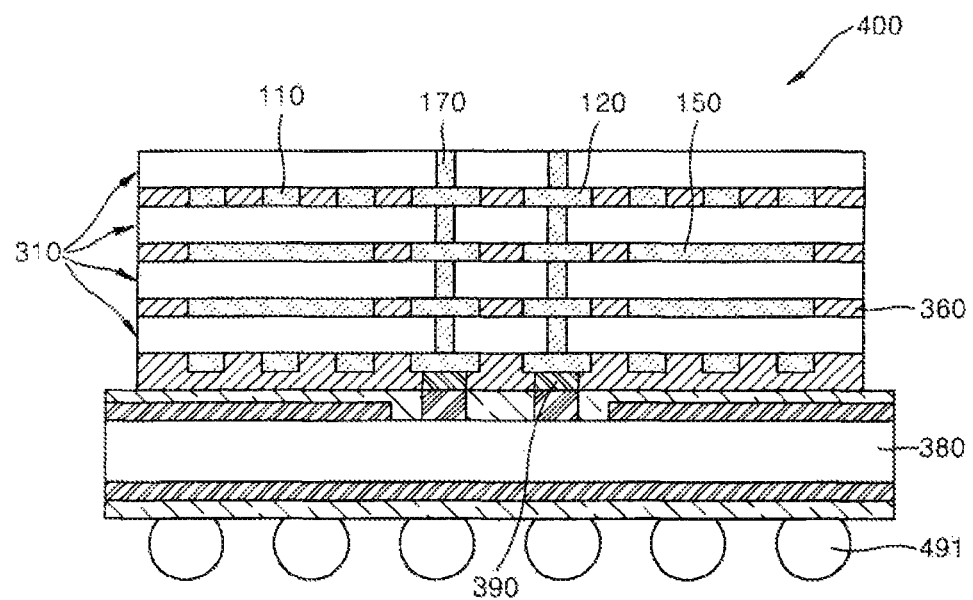
FIG. 12 is a cross-sectional view of a stack module according to an embodiment of the present invention.

FIG. 12 is a cross-sectional view of a stack module 400 according to an embodiment of the present invention. Referring to FIG. 12, the stack module 400 may be substantially the same as the semiconductor package 300 illustrated in FIG. 10 except that external terminals 491 are further added thereto. For example, the external terminals 491 may be attached to a base substrate 380 and be used to connect a plurality of semiconductor devices 310 to an external product. For example, the external terminals 491 may include solder balls or bumps.

The semiconductor devices 310 stacked on the base substrate 380 may be molded with a molding material, such as an epoxy molding compound (EMC) (not shown), so that they can be protected from an external impact or contamination.

Figure 13:
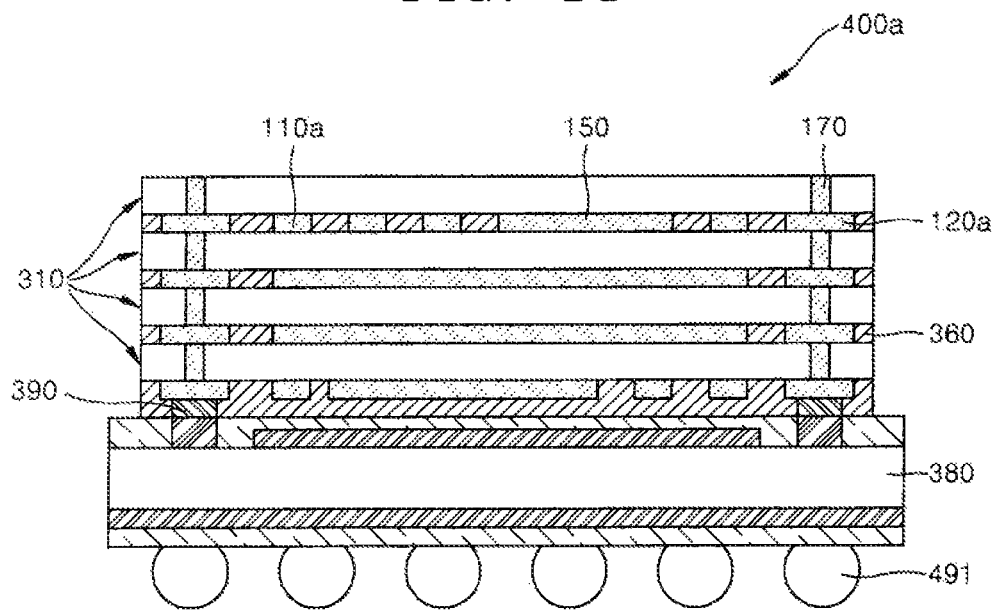
FIG. 13 is a cross-sectional view of a stack module according to another embodiment of the present invention.

FIG. 13 is a cross-sectional view of a stack module 400a according to an embodiment of the present invention. Referring to FIG. 13, the stack module 400a may be substantially the same as the semiconductor package 300a illustrated in FIG. 11 except that external terminals 491 are further added thereto.

Figure 14:
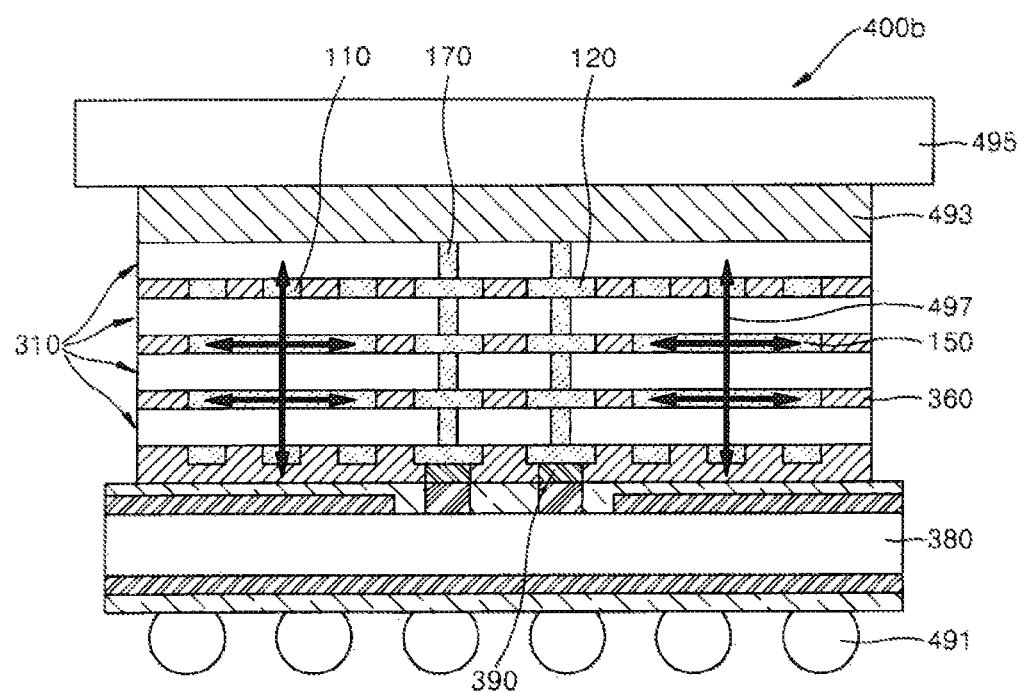
FIG. 14 is a cross-sectional view of a stack module according to another embodiment of the present invention.

FIG. 14 is a cross-sectional view of a stack module 400b according to another embodiment of the present invention. The stack module 400b is similar to the stack module 400 illustrated in FIG. 12 and thus, a detailed description of constitutional elements of the stack module 400b that are the same as those of the stack module 400 will be omitted here.

Referring to FIG. 14, a heat dissipating plate 495 may be stacked on an uppermost layer of a plurality of semiconductor devices 310. For example, the heat dissipating plate 495 may be formed of high conductive metal, and adhered to the uppermost layer of the semiconductor devices 310 via tape 493.

Heat generated by the semiconductor devices 310 can be evenly dispersed along paths of heat transmission 497 via dummy pads 110 and connecting lines 150. A vertical component for transmission of heat is discharged to the outside via the heat dissipating plate 495, thereby lowering the internal temperature of the stack module 400b.

Figure 15:
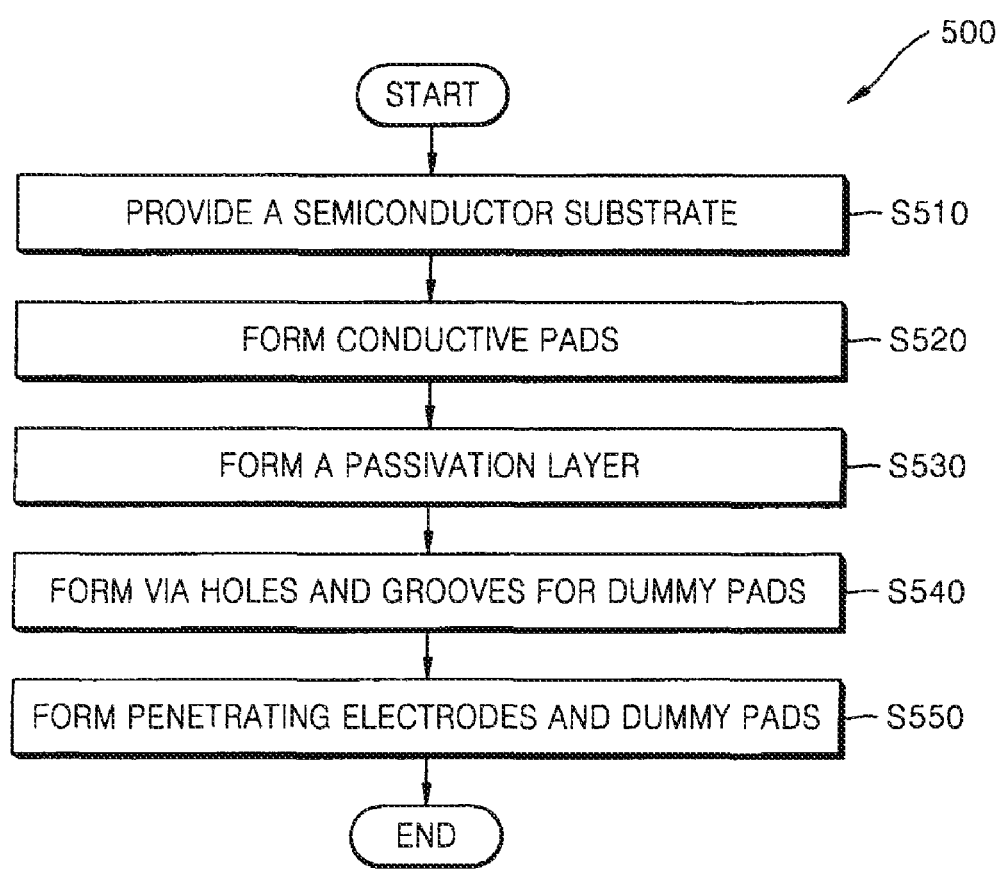
FIG. 15 is a flowchart illustrating a method of manufacturing a semiconductor device according to an embodiment of the present invention.

FIG. 15 is a flowchart illustrating a method 500 of manufacturing a semiconductor device according to an embodiment of the present invention. Referring to FIG. 15, a semiconductor substrate having a first surface and a second surface is prepared (S510). Then, conductive pads may be formed on the first surface of the semiconductor substrate (S520). Thereafter, a passivation layer may be formed on the conductive pads (S530). The passivation layer may be patterned to expose the upper parts of the conductive pads.

Next, via holes may be formed right below the conductive pads in order to pass through the semiconductor substrate (S540). The via holes may be formed by etching the semiconductor substrate by using laser drilling or dry etching. Laser drilling can be performed without a photo mask, but dry etching may need the photo mask in order to expose the via holes. If redistribution pads and redistribution lines are further formed to be coupled to the conductive pads, the via holes may be formed right below the redistribution pads. Grooves for dummy pads may be formed by patterning the passivation layer after or simultaneously with forming the via holes.

Next, penetrating electrodes or dummy pads may be formed by filling up the via holes and the grooves for dummy pads with a conductive layer (S550). For example, the conductive layer may include aluminum or copper. Before forming the conductive layers, a barrier layer may further be formed within the via holes and the grooves for dummy pads. For example, the barrier layer may include Ti, TiN and/or TaN. Further, if the conductive layer includes copper, a seed layer may further be formed in the via holes and the grooves for dummy pads. For example, the seed layer may include aluminum or copper.

The grooves for dummy pads may further include trenches for connecting the dummy pads to one another. In this case, connecting lines may be formed simultaneously with forming the dummy pads. The passivation layer for forming such grooves for dummy pads may be patterned in masks of various types, sizes, or shapes in order to effectively discharge heat. After the penetrating electrodes, the dummy pads and the connecting lines are formed, the barrier layer and/or the seed layer is removed, thus obtaining the semiconductor device having good performance of heat emission.

Figure 16:
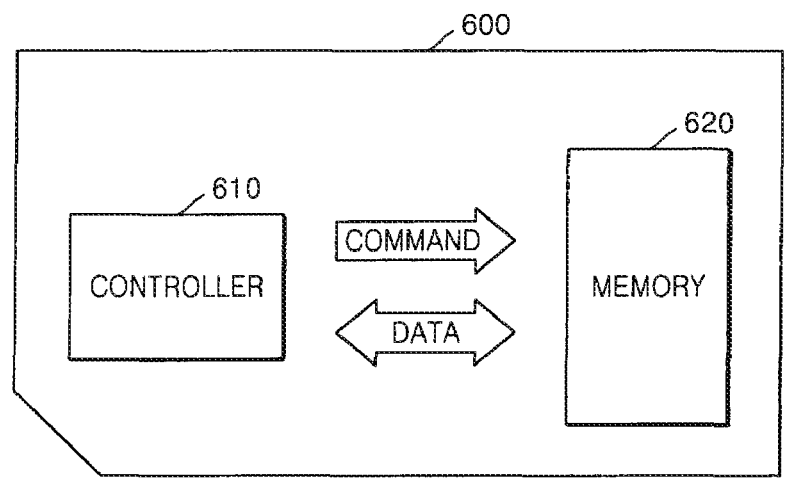
FIG. 16 is a schematic block diagram of a card according to an embodiment of the present invention.

FIG. 16 is a schematic block diagram of a card 600 according to an embodiment of the present invention. Referring to FIG. 16, a controller 610 and a memory 620 are arranged to exchange an electrical signal with each other. For example, if the controller 610 gives a command, the memory 620 may transmit data. The card 600 may be used as a memory device, such as a multi-media card (MMC) or a secure digital (SD) card.

The memory 620 may correspond to one of the semiconductor devices 100, 100a, 100b, 100c, 100d, 100e, 100f, or 100g illustrated in FIGS. 1 through 9, the semiconductor packages 300 or 300a illustrated in FIGS. 10 and 11, or the stack modules 400, 400a, or 400b illustrated in FIGS. 12 through 14. For example, the memory 620 may be dynamic random access memory (DRAM), static RAM (SRAM), flash memory, phase change RAM (PRAM), ferroelectric RAM (FRAM), magnetic RAM (MRAM) and/or resistive RAM (RRAM).

Figure 17:
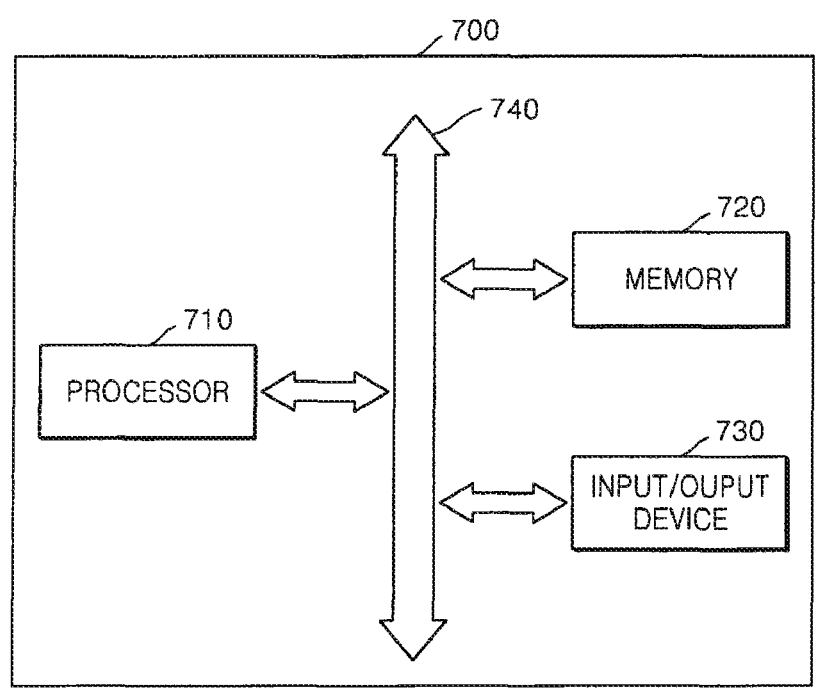
FIG. 17 is a schematic block diagram of a system according to an embodiment of the present invention.

FIG. 17 is a block diagram of a system 700 according to an embodiment of the present invention. Referring to FIG. 17, a processor 710, an input/output device 730 and a memory 720 can establish a data communication with one another via a bus 740. The processor 710 can execute a program and controls the operation of the system 700. The input/output device 730 can be used to input data to or output data from the system 700.

The memory 620 may correspond to one of the semiconductor devices 100, 100a, 100b, 100c, 100d, 100e, 100f, or 100g illustrated in FIGS. 1 through 9, the semiconductor packages 300 or 300a illustrated in FIGS. 10 and 11, or the stack modules 400, 400a, or 400b illustrated in FIGS. 12 through 14. For example, the memory 620 may be a DRAM, an SRAM, a flash memory, a PRAM, an FRAM, an MRAM and/or an RRAM.

The memory 720 may store code or data for operating the processor 710. The system 700 may be coupled to an external device via the input/output device 730 in order to exchange data with the external device. The system 700 can be applied to various devices, such as a mobile phone, a solid state disk (SSD), or an MP3 player.

According to the above embodiments, the heat spreading efficiency of a semiconductor device can be increased. Thus, it is possible to prevent the hot-spot phenomenon where the internal temperature of a semiconductor device is locally increased, and maintain the temperature of the semiconductor device at a constant level. Thus, the quality and reliability of the semiconductor device can be improved, and the product characteristics thereof can be maintained in a more stable manner when operating the semiconductor device.

In the semiconductor package and the stack module according to the above embodiments, it is possible to easily control dispersion and transmission of heat between upper and lower semiconductor devices. Accordingly, it is possible to prevent the product characteristics of the semiconductor device from degrading when it operates at high temperature, and improve the quality and reliability of assembling during a chip bonding process.

In the semiconductor device according to the above embodiments, penetrating electrodes can be easily manufactured by simply adding a pattern for forming dummy pads and/or connecting lines, thereby reducing the manufacturing costs and increasing the productivity.

Also, it is possible to increase the efficiency of heat dissipation while maintaining the sizes of the semiconductor device, the semiconductor package, or the stack module according to the above embodiments as conventionally. Further, the semiconductor package and the stack module according to the above embodiment are advantageous in that gaps between a plurality of semiconductor devices can be maintained at a constant level.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor device comprising:
    a semiconductor substrate having circuit structure;
    an insulating material on the circuit structure;
    at least one conductive pad on a surface of the insulating material, the conductive pad being electrically connected to the circuit structure;
    a plurality of heat conductors on the surface of the insulating material and electrically isolated from the circuit structure, the heat conductors for dissipating heat and arranged adjacent to the at least one conductive pad,
    wherein heat conductors are arranged in the form of a lattice pattern to thereby define a heat conductor pattern.

2. The semiconductor device of claim 1, wherein the at least one conductive pads includes a plurality of conductive pads on opposite edges of the semiconductor substrate to define an edge pad structure, and wherein the plurality of heat conductors comprise:
    elongate first heat conductors located on a central region of the insulating material between the conductive pads of the edge pad structure;
    second heat conductors located on opposite sides the first heat conductors on the insulating material and between the conductive pads of the edge pad structure, wherein the second heat conductors are smaller than the elongate first heat conductors; and
    metal lines thermally connecting the elongated first heat conductors and the second heat conductors.

3. The semiconductor device of claim 1, wherein the at least one conductive pads includes a plurality of conductive pads in a central region of the semiconductor substrate to define an center pad structure, and wherein the plurality of heat conductors comprise:
    a plurality of first heat conductors arranged on one side of the center pad structure;
    a plurality of second heat conductors arranged an opposite side of the center pad structure;
    first metal lines thermally connecting the first heat conductors; and
    second metal lines thermally connecting the second heat conductors.

* * * * *